US011018225B2

(12) United States Patent
Bruce et al.

(10) Patent No.: US 11,018,225 B2
(45) Date of Patent: May 25, 2021

(54) III-V EXTENSION BY HIGH TEMPERATURE PLASMA DOPING

(71) Applicant: INTERNATIONAL BUSINESS MACHINES CORPORATION, Armonk, NY (US)

(72) Inventors: Robert L. Bruce, White Plains, NY (US); Kevin K. Chan, Staten Island, NY (US); Sebastian U. Engelmann, White Plains, NY (US); Renee T. Mo, Yorktown Heights, NY (US); Christopher Scerbo, Bronx, NY (US); Hongwen Yan, Somers, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/195,107

(22) Filed: Jun. 28, 2016

(65) Prior Publication Data
US 2017/0373149 A1    Dec. 28, 2017

(51) Int. Cl.
*H01L 21/22*     (2006.01)
*H01L 29/10*     (2006.01)
(Continued)

(52) U.S. Cl.
CPC .... *H01L 29/1041* (2013.01); *H01L 21/02068* (2013.01); *H01L 21/02274* (2013.01);
(Continued)

(58) Field of Classification Search
CPC ....... H01L 21/02068–02074; H01L 21/02087; H01L 21/02054; H01L 21/02052;
(Continued)

(56) References Cited

U.S. PATENT DOCUMENTS

| 5,199,994 A | 4/1993 | Aoki | |
|---|---|---|---|
| 6,312,999 B1 * | 11/2001 | Chivukula | ............ H01L 29/665 |
| | | | 257/E21.438 |

(Continued)

FOREIGN PATENT DOCUMENTS

| JP | H02278720 A | 11/1990 |
|---|---|---|
| JP | 6061150 A | 3/1994 |

(Continued)

OTHER PUBLICATIONS

Kong, E. et al., "Plasma Doping of InGaAs at Elevated Substrate Temperature for Reduced Sheet Resistance and Defect Formation" IEEE Transactions on Electron Devices (Sep. 2014) pp. 3159-3165, vol. 61, No. 9.

(Continued)

*Primary Examiner* — Moin M Rahman
(74) *Attorney, Agent, or Firm* — Tutunjian & Bitetto, P.C.; Erik Johnson (57) ABSTRACT

A method for forming an overlap transistor includes forming a gate structure over a III-V material, wet cleaning the III-V material on side regions adjacent to the gate structure and plasma cleaning the III-V material on the side regions adjacent to the gate structure. The III-V material is plasma doped on the side regions adjacent to the gate structure to form plasma doped extension regions that partially extend below the gate structure.

10 Claims, 6 Drawing Sheets

(51) Int. Cl.
  *H01L 21/02* (2006.01)
  *H01L 21/223* (2006.01)
  *H01L 29/20* (2006.01)
  *H01L 29/66* (2006.01)

(52) U.S. Cl.
  CPC ...... *H01L 21/2233* (2013.01); *H01L 21/2236* (2013.01); *H01L 29/20* (2013.01); *H01L 29/66803* (2013.01)

(58) Field of Classification Search
  CPC ....... H01L 21/02101; H01L 21/02046–02049; H01L 21/02096; H01L 29/66803; H01L 27/0924; H01L 21/823807; H01L 21/02164; H01L 21/02167; H01L 21/0217; H01L 21/02126; H01L 21/3247; H01L 21/2236; H01L 21/2254; H01L 29/7851; H01L 29/7853; H01L 29/1037; H01L 29/167; H01L 21/823821; H01L 21/823814; H01L 29/66795; H01L 29/785; H01L 29/66818; H01L 29/66545; H01L 21/845; H01L 29/1054; H01L 29/7854; H01L 29/51; H01L 29/10; H01L 29/78; H01L 21/28; H01L 21/823857; H01L 21/28194; H01L 29/513; H01L 29/517; H01L 21/823431; H01L 27/0886; H01L 27/10826; H01L 27/10879; H01L 27/1211; H01L 29/41791; H01L 2924/13067; H01L 21/02274; H01L 21/3065–30655; H01L 21/31116; H01L 21/31122; H01L 21/32136–21/32137; H01L 21/02071
  USPC ........ 438/136, 137, 455–458, 149–165, 173, 438/192, 206, 212, 424, 427, 428, 591; 257/20, 194, 135–136, 213–413, 900, 257/902–903
  See application file for complete search history.

(56) References Cited

U.S. PATENT DOCUMENTS

| | | | |
|---|---|---|---|
| 7,816,188 B2 | 10/2010 | Vyvoda et al. | |
| 8,129,202 B2 | 3/2012 | Okumura et al. | |
| 8,871,619 B2 | 10/2014 | Adibi et al. | |
| 8,997,688 B2 | 4/2015 | Adibi et al. | |
| 2002/0160592 A1* | 10/2002 | Sohn | H01L 21/268 438/535 |
| 2004/0092062 A1* | 5/2004 | Ahmed | H01L 29/42384 438/197 |
| 2008/0171412 A1* | 7/2008 | Cheng | H01L 21/02057 438/218 |
| 2009/0029529 A1 | 1/2009 | Shin | |
| 2009/0242936 A1* | 10/2009 | Cheng | H01L 29/66545 257/190 |
| 2009/0325356 A1* | 12/2009 | Shin | H01L 21/02274 438/303 |
| 2012/0061762 A1* | 3/2012 | Cheng | H01L 21/2633 257/365 |
| 2012/0119307 A1* | 5/2012 | Li | H01L 21/76816 257/410 |
| 2012/0273798 A1* | 11/2012 | Alptekin | H01L 23/485 257/77 |
| 2012/0292715 A1* | 11/2012 | Hong | H01L 21/845 257/392 |
| 2012/0326230 A1* | 12/2012 | Cheng | H01L 21/84 257/347 |
| 2013/0161767 A1* | 6/2013 | Rouh | H01L 21/28035 257/412 |
| 2015/0069466 A1* | 3/2015 | Chang | H01L 21/30608 257/192 |
| 2015/0118839 A1* | 4/2015 | Bruce | H01L 21/0206 438/595 |
| 2016/0247726 A1* | 8/2016 | Huang | H01L 21/823418 |
| 2016/0293371 A1* | 10/2016 | Liu | H01H 59/0009 |
| 2017/0054006 A1* | 2/2017 | Avci | H01L 29/78681 |

FOREIGN PATENT DOCUMENTS

| | | |
|---|---|---|
| JP | 2009038316 A | 2/2009 |
| TW | I384536 B | 2/1995 |

OTHER PUBLICATIONS

Torregrosa, F. et al., "High Temperature Plasma Immersion Ion Implantation of AsH3 Using PULSION®" 20th International Conference on Ion Implantation Technology (IIT) (Jun./Jul. 2014) pp. 1-4.

Turnbaugh, D. et al., "Advances in Plasma Doping on FinFETS and other Applications Using PULSION®" Ion Beam Services, Semicon West (2014) San Francisco, pp. 1-31.

* cited by examiner

III-V EXTENSION BY HIGH TEMPERATURE PLASMA DOPING

BACKGROUND

Technical Field

The present invention generally relates to semiconductor processing, and more particularly to, devices and methods for forming an extension dopant region in III-V devices by plasma doping.

Description of the Related Art

InGaAs materials are employed in many semiconductor device applications, especially for high speed applications. InGaAs has a native oxide that forms thereon and is very difficult to remove even with HCl or HF solutions. According to Gibb's free energy prediction, only less stable oxides such as $In_2O$ or $Ga_2O$ can be removed while more stable oxides are retained. Since InGaAs native oxides cannot be removed completely by HCl or HF solution, surface native oxides on the InGaAs surface interfere with doping the InGaAs.

Implant extension formation causes the InGaAs to amorphize due to implant damage and strain relaxation. Extremely high sheet resistance occurs due to a low fin re-crystallization temperature, and high temperatures result in composition segregation of the InGaAs and excessive dopant diffusion. High sheet resistance ($R_s$) and excessive dopant diffusion degrade transistor performance and limit scalability as it is difficult to form shallow junctions with implanted dopants.

To form an extension region below a spacer in a channel region, high temperature annealing is needed for dopant diffusion passed the spacer (e.g., diffusion over the width of spacer) to a gate edge. As described, high temperature amorphization can occur with the high temperature annealing especially after implantation damage. For InGaAs fins, it is extremely difficult to reach the gate edge with diffused dopants using a low temperature annealing.

SUMMARY

In accordance with an embodiment of the present principles, a method for forming an overlap transistor includes forming a gate structure over a III-V material, wet cleaning the III-V material on side regions adjacent to the gate structure and plasma cleaning the III-V material on the side regions adjacent to the gate structure. The III-V material is plasma doped on the side regions adjacent to the gate structure to form plasma doped extension regions that partially extend below the gate structure.

Another method for forming an overlap transistor includes forming fins from a III-V material; forming a gate structure over the fins; removing a native oxide from the fins by: wet cleaning the fins; and plasma cleaning the fins to remove stable native oxides; and plasma doping the fins on a top and side regions of the fins adjacent to the gate structure to form plasma doped extension regions in the fins that partially extend below the gate structure.

An overlap transistor includes a gate structure formed over a III-V material, the III-V material having native oxides removed. Plasma doped extension regions are formed in the III-V material on the side regions adjacent to the gate structure that partially extend below the gate structure. A channel is formed between the plasma doped extension regions below the gate structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, methods and devices are provided that employ high temperature plasma for doping III-V materials. In one embodiment, the high temperature plasma is provided for forming extension regions below a gate structure in a field effect transistor (FET) device. The extension regions are in-situ doped using the plasma. In one embodiment, the III-V material is doped with Si dopants to form an n-type field effect transistor (NFET).

The high temperature plasma provides a cleaning process. The native oxides formed on a surface of the III-V material can be completely removed by plasma excited ion bombardment. The plasma removes oxides where even HCl and HF cannot during conventional etching processes. In one embodiment, wet etching with strong acids or bases, e.g., HCl, $NH_4OH$ or HF, is employed followed by plasma cleaning. After plasma cleaning, a perimeter region near the III-V channel receives plasma Si doping at high temperature in which plasma excited Si radicals react with the III-V elements and activate the material. While Si doping is preferred, other materials may be employed.

A plasma Si cap may be in-situ deposited to protect the integrity of extension regions. Si grows on gate sidewalls, e.g., in the <110> direction, far slower, than on the III-V surface so there is little or no additional gate width.

The extension regions formed in accordance with the present principles extend below the gate structure and beyond the gate structure to form source and drain regions. This structure provides an overlap structure for an overlap transistor device.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., InGaAs. These compounds include different proportions of the elements within the compound, e.g., InGaAs includes $In_xGa_{1-x}As$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 1:
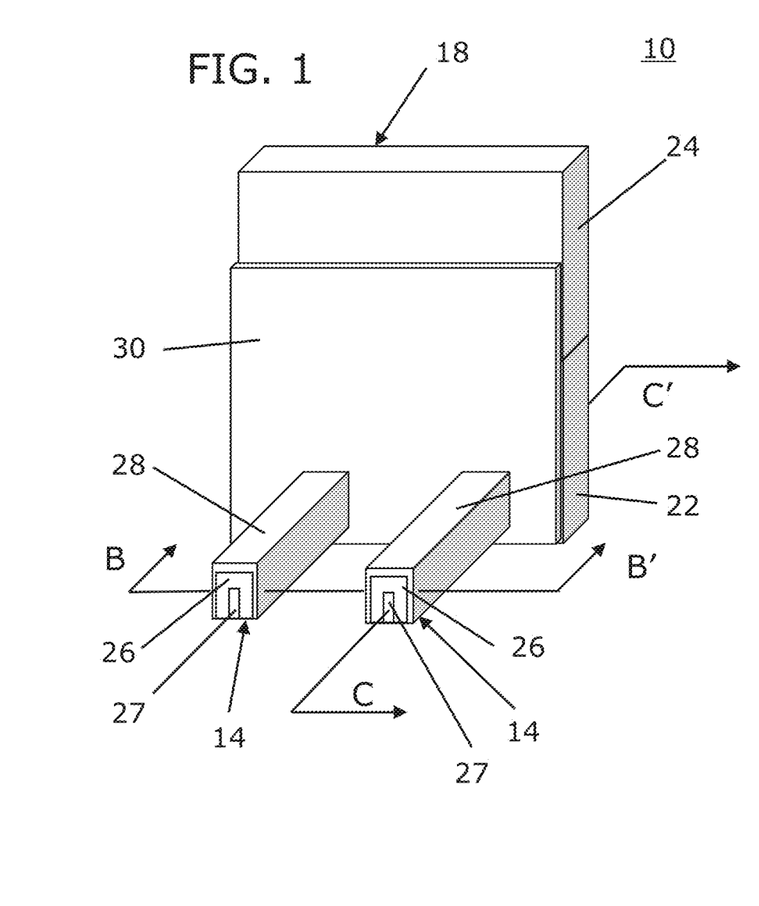
FIG. 1 is a perspective view of a semiconductor device forming an overlap transistor using plasma doped extension regions and a plasma deposited cap layer formed only on fins in accordance with the present principles.
Figure 2:
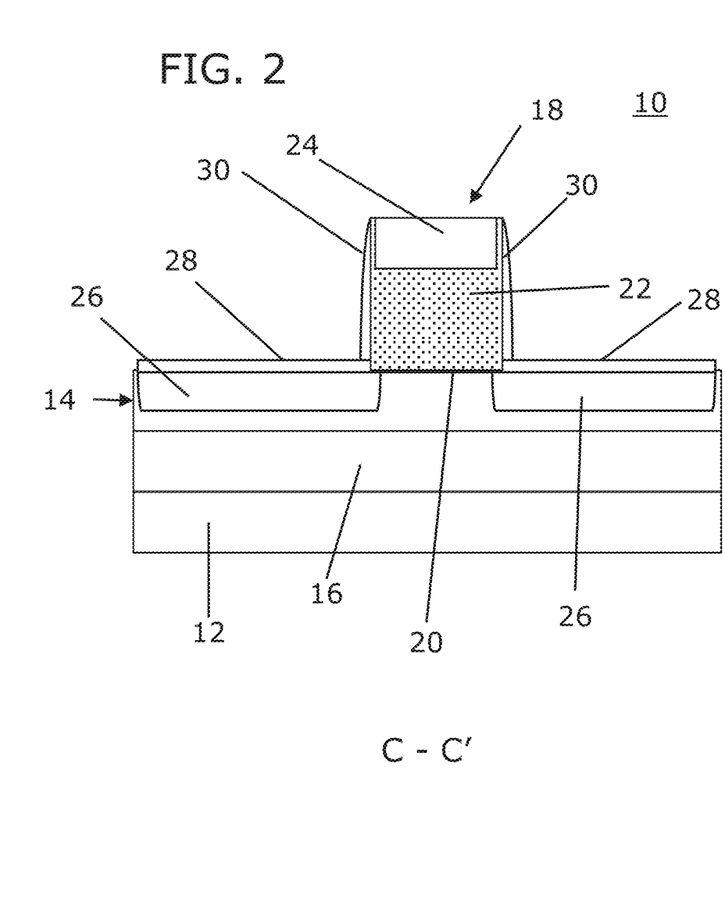
FIG. 2 is a cross-sectional view taken at section line C-C' in FIG. 1 showing the plasma doped extension regions and a plasma deposited cap layer on the fins in accordance with the present principles.

Referring now to the drawings in which like numerals represent the same or similar elements and initially to FIGS. 1 and 2, a partially fabricated semiconductor device 10 is illustratively shown in accordance with the present principles. FIG. 1 shows a perspective view, and FIG. 2 shows a cross-sectional view taken at section line C-C' of FIG. 1. The device 10 is formed on a substrate 12 and includes fins 14. The fins 14 may be formed from a III-V material.

The term "III-V compound semiconductor" denotes a semiconductor material that includes at least one element from Group III of the Periodic Table of Elements and at least one element from Group V of the Periodic Table of Elements. III-V compound semiconductors are binary, ternary or quaternary alloys including III/V elements. Examples of III-V compound semiconductors that can be used in accordance with the present principles include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP), etc. and combinations thereof. In a particularly useful embodiment, the fins 14 include InGaAs.

The fins 14 may be etched from substrate material or may be grown from the substrate material. In one embodiment, the substrate 12 may include a silicon wafer and a buffer layer or layers 16 are formed thereon to provide lattice-matching for the III-V material of the fins 14. For example, if the wafer is Si, a suitable buffer layer 16 may include InP and the fins 14 may include InGaAs. Other materials are also contemplated.

After the formation of the fins 14, a gate stack 18 is formed transversely over the fins 14. The gate stack 18 includes a gate dielectric 20, which may include one or more of a native oxide and/or a dielectric layer (e.g., a high-k dielectric or other dielectric material or materials). The gate stack 18 may be formed by blanket depositing material layers for the gate dielectric 20 and at least one gate conductor 22 to provide the gate stack 18, wherein the gate stack 18 is patterned and etched. Specifically, a pattern is produced by applying a photoresist to a surface to be etched, exposing the photoresist to a pattern of radiation, and then developing the pattern into the photoresist utilizing a resist developer. A hardmask 24 may be employed over the gate conductor 22 and employed to pattern and/or protect the gate conductor 22. The hardmask 24 may form a gate cap and may include, e.g., a nitride or oxide.

Once the patterning of the photoresist is completed, the sections covered by the photoresist are protected while the exposed regions are removed using a selective etching process that removes the unprotected regions. Alternatively, the gate stack 18 can be formed by replacement gate technology. In a replacement gate process sequence, a sacrificial gate structure is formed at this stage of the process flow. The sacrificial gate structure may also be referred to as a dummy gate. The sacrificial gate structure may be composed of a semiconductor material or dielectric material. Later in the process sequence, the sacrificial gate structure is removed, and replaced with a functional gate structure having at least one gate dielectric 18 and the at least one gate conductor 22, as described above. In some instances, in the replacement gate method, the functional gate structure may be formed after the source and drain regions have been processed.

The gate conductor 22 includes a conductive material(s), such as, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

After the formation of the gate stack 18, a wet cleaning may be performed on the fins 14. Native oxides are removed by a solution of hydrochloric acid (HCl) or hydrofluoric acid (HF) (e.g., diluted HCl or HF solutions) or a solution of ammonium hydroxide ($NH_4OH$)) (e.g., diluted $NH_4OH$ solution). The etch chemistry may be diluted with distilled water ($H_2O$) at a ratio of, e.g., approximately 3:1 to approximately 500:1.

Surface native oxides that are more stable are further removed by plasma excited ion bombardment or plasma cleaning. Plasma cleaning removes additional oxides that could not be removed by wet cleaning/etching. During plasma cleaning/etching the surface to be etched is placed on a radiofrequency (RF) powered electrode. Moreover, during plasma excited ion bombardment, the surface to be etched takes on a potential that accelerates the etching species extracted from plasma toward the surface, in which a chemical etching reaction is taking place in a direction normal to the surface. In one embodiment, plasma cleaning includes removal of impurities and contaminants from surfaces through the use of an energetic plasma created from gaseous species. Gases such as argon, helium, xeon, as well as mixtures such as air and hydrogen/nitrogen may be employed. The plasma is created by using high frequency voltages (e.g., kHz to >MHz) to ionize low pressure gas (around 1/1000 atmospheric pressure), although other pressures including atmospheric pressure plasmas may also be employed. In one embodiment, Ar/He ion bombardment removes native oxide to expose In—, Ga—, and As— bonds.

Ion bombardment removes InGaAs native oxides. This increases root mean square (RMS) (surface properties) and sheet resistance $R_s$ at least remains same. The addition of plasma Si extension doping provides more radicals of $Si^+$, $SiH^{2+}$, $SiH^{3+}$ in the fins 14 (e.g., in InGaAs), reduces external resistance ($R_{ext}$) and forms Si dopant extensions 26 in, e.g., InGaAs, to become the overlap device.

After plasma cleaning, a perimeter region near a III-V channel (below the gate structure 18) in the fins 14 receives plasma doping at a temperature of, e.g., between about 40 to about 550 degrees C., in which plasma excited radicals react with the III-V elements in the fins 14 and are activated in the channel. In-situ plasma extension doping is provided to form extension regions 26.

The perimeter doping forms a horseshoe or upside down U-shaped dopant profiles with a central portion 27 having less dopant concentration. In one embodiment, the perimeter doping extends through the fin 14. The energy of the plasma doping may be adjusted to obtain a desired dopant profile for region 26 (and portion 27). In one embodiment, the channel includes the central portion 27 between or through the extensions 26.

The in-situ plasma doping continues to form an in-situ selective plasma spacer or cap 28. The selectively deposited spacer or cap 28 may include Si, SiGe or Ge, and in other embodiments, may include Se or Te. These dopants form an NFET device. Other dopants may be employed to form a PFET device.

Because of the growth difference between <110> and <100> surfaces, Si thickness deposited on <110> surfaces is about ⅙ that of <100> surfaces; e.g., Si <110> can be less than about 1 nm. The in-situ plasma cap 28 may be deposited to protect the integrity of the extension regions 26. Because Si grows on the gate sidewall (e.g., the <110> direction) far slower, there is little or no additional gate width added.

In accordance with the present principles, ion bombardment in a plasma clean and in-situ plasma doping provide more incorporation of plasma excited dopants into the extension regions 26. The native oxides are removed, which permits a larger and deeper concentration of dopants (e.g., Si). In one embodiment, with a greater incorporation of Si dopants, the sheet resistance ($R_s$) is decreased from e.g., about 60 ohms/square (with native oxide) to about 40 ohms/square (with native oxide removed by wet etch and plasma). Plasma deposition was about 3 nm for the cap 28 for these illustrative measurements.

Gate sidewall spacers 30 may be formed (optional) in direct contact with the gate structure 18. The gate sidewall spacers 30 may be formed by depositing a conformal layer of dielectric material, such as an oxide, a nitride (e.g., boron nitride, silicon boron nitride, silicon boron carbon nitride, etc.), oxynitrides or combinations thereof, on the gate structure 18 followed by an etch process that removes the conformal layer from all of the surfaces of the gate structure 18 and the plurality of fins 14 except for the sidewalls of the gate structure 18. The gate sidewall spacers 30 may have a width ranging from about 1 nm to about 10 nm. The width depends on the scale of the device scale and the design of the device.

The formation of the gate sidewall spacers 30 is formed over the cap 28. In one embodiment, the plasma dopants form extension regions 26 that extend under the gate structure 18 to form an overlap device. The resistance ($R_s$) of the extension regions 26 is reduced over conventional structures.

In accordance with some embodiments, a 10 second plasma Si doping process resulted in ~$6 \times 10^{19}$ atoms/cc Si dopant concentration to ~20 nm deep into the InGaAs layer (fin 14) with ~80 Angstroms/decade of Si dopant profile in InGaAs. The plasma doping parameters may include 80 milliTorr (mT) to about 500 mT and 0 Watt bias (wB) to about 250 Watt bias.

Figure 3:
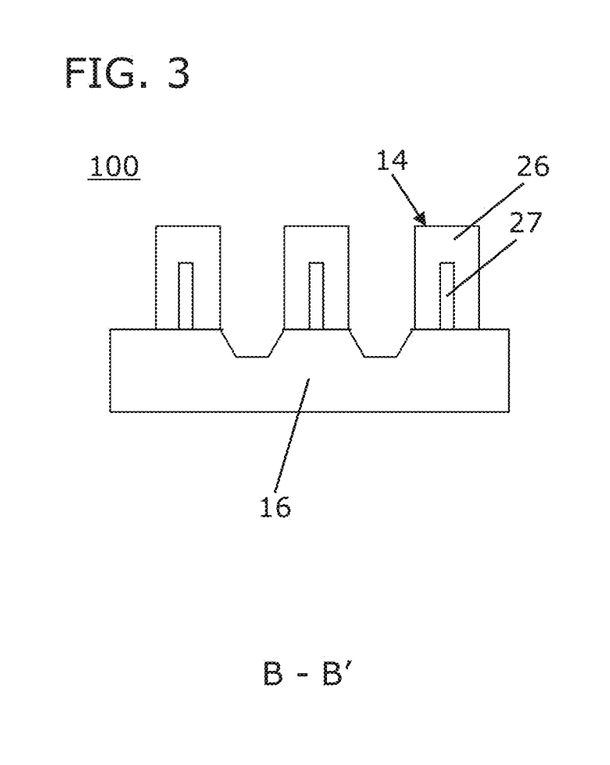
FIG. 3 is a cross-sectional view taken at section line B-B' in FIG. 1 showing the plasma doped extension regions with no cap layer formed in accordance with another embodiment.
Figure 4:
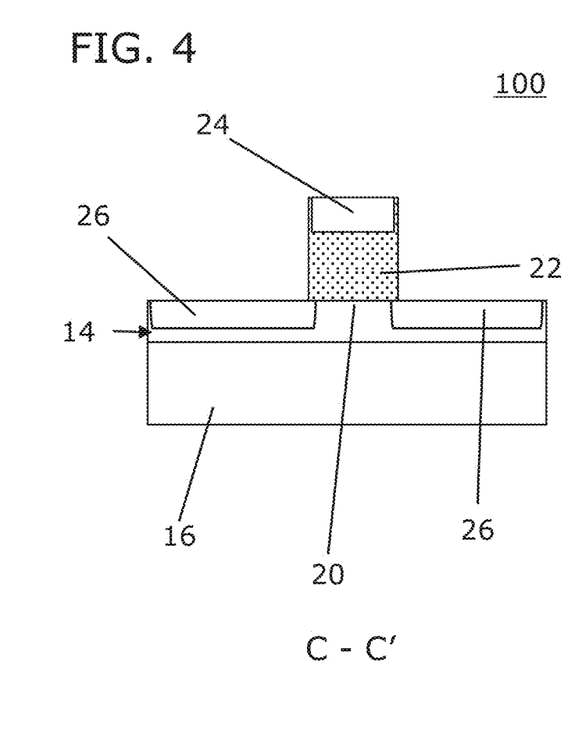
FIG. 4 is a cross-sectional view taken at section line C-C' in FIG. 1 showing the plasma doped extension regions with no cap layer formed in accordance with another embodiment.

Referring to FIGS. 3 and 4, a partially fabricated semiconductor device 100 is illustratively shown in accordance with the present principles. FIG. 3 shows a cross-sectional view taken at section line B-B' of FIG. 1, and FIG. 4 shows a cross-sectional view taken at section line C-C' of FIG. 1. The device 100 shows an embodiment where the extensions 26 are formed without the formation of a cap 28 (FIG. 2). Spacers 30 (FIG. 2) are also optional.

Figure 5:
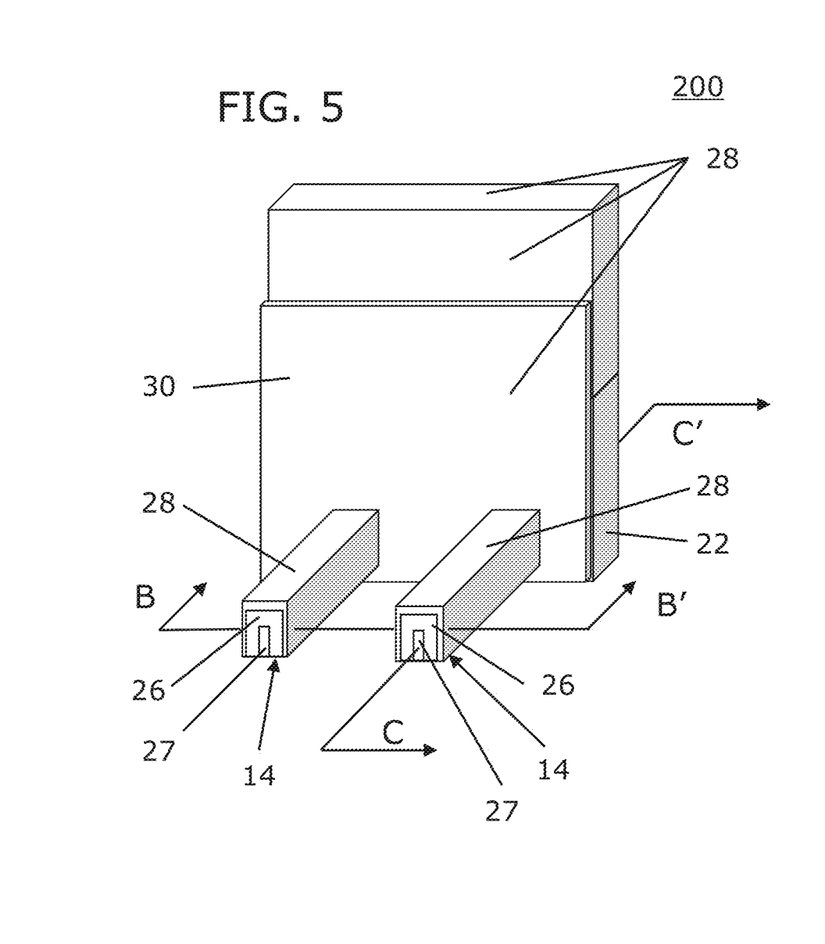
FIG. 5 is a perspective view of a semiconductor device forming an overlap transistor using plasma doped extension regions and a plasma deposited cap layer formed on all surfaces in accordance with the present principles.

Referring to FIG. 5, a partially fabricated semiconductor device 200 is illustratively shown in accordance with another embodiment. FIG. 5 shows a perspective view of the device 200. The device 200 shows an embodiment where the cap 28 is formed over all surfaces. The cap may be selectively removed as needed from different regions to access underlying materials or layers.

Figure 6:
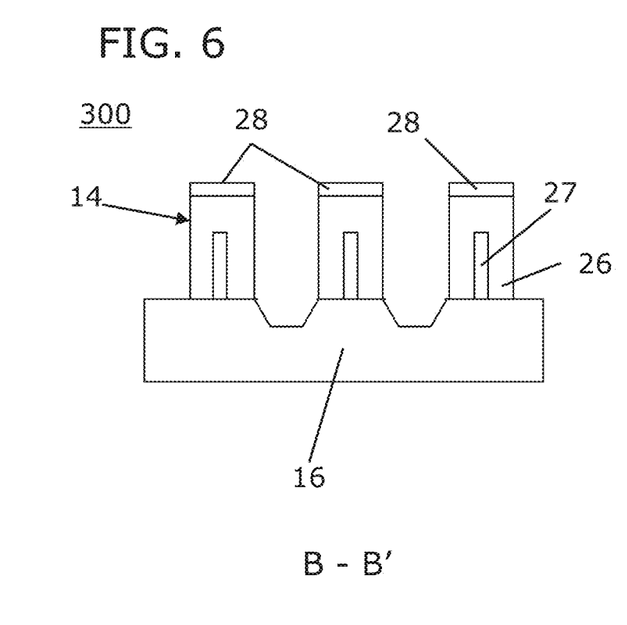
FIG. 6 is a cross-sectional view taken at section line B-B' in FIG. 1 showing the plasma doped extension regions with a cap layer formed on a top of fins in accordance with another embodiment.
Figure 7:
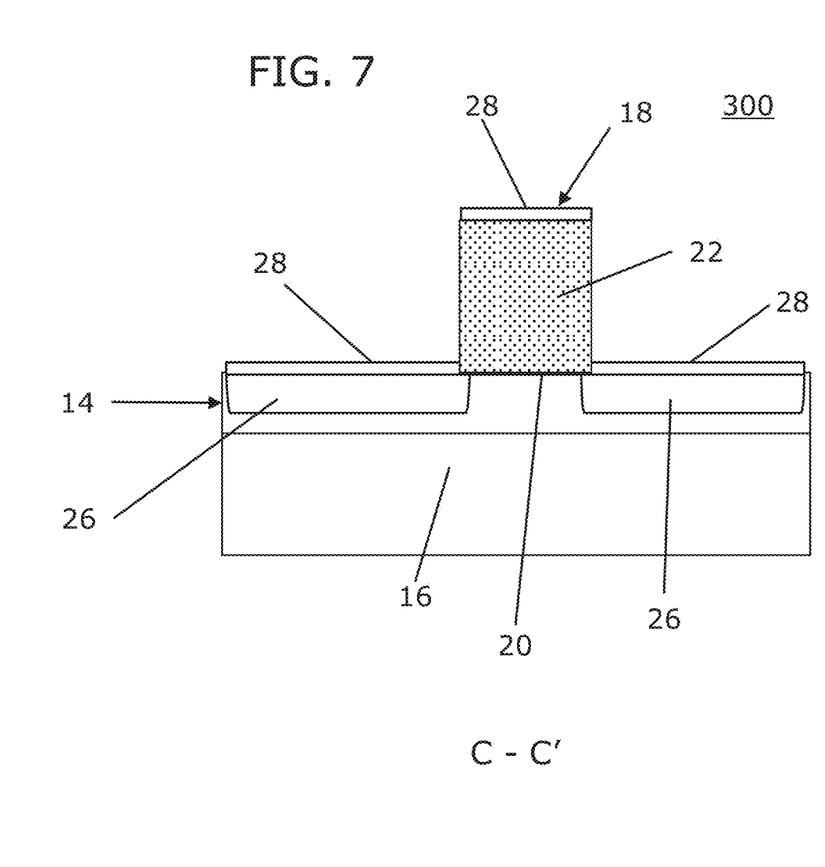
FIG. 7 is a cross-sectional view taken at section line C-C' in FIG. 5 showing the plasma doped extension regions with a cap layer formed on top of the fins and on top of a gate structure in accordance with another embodiment.

Referring to FIGS. 6 and 7, a partially fabricated semiconductor device 300 is illustratively shown in accordance with the present principles. FIG. 6 shows a cross-sectional view taken at section line B-B' of FIG. 5, and FIG. 7 shows a cross-sectional view taken at section line C-C' of FIG. 5. The device 300 shows an embodiment where the cap 28 is formed on top of the fins 14 and/or extensions 26 and on top of the gate structure 18 (FIG. 7). Spacers 30 (FIG. 2) are also optional and not shown. The cap 28 may be selectively grown on horizontal surfaces with a deposition rate of vertical surfaces being much less, as described above.

Figure 8:
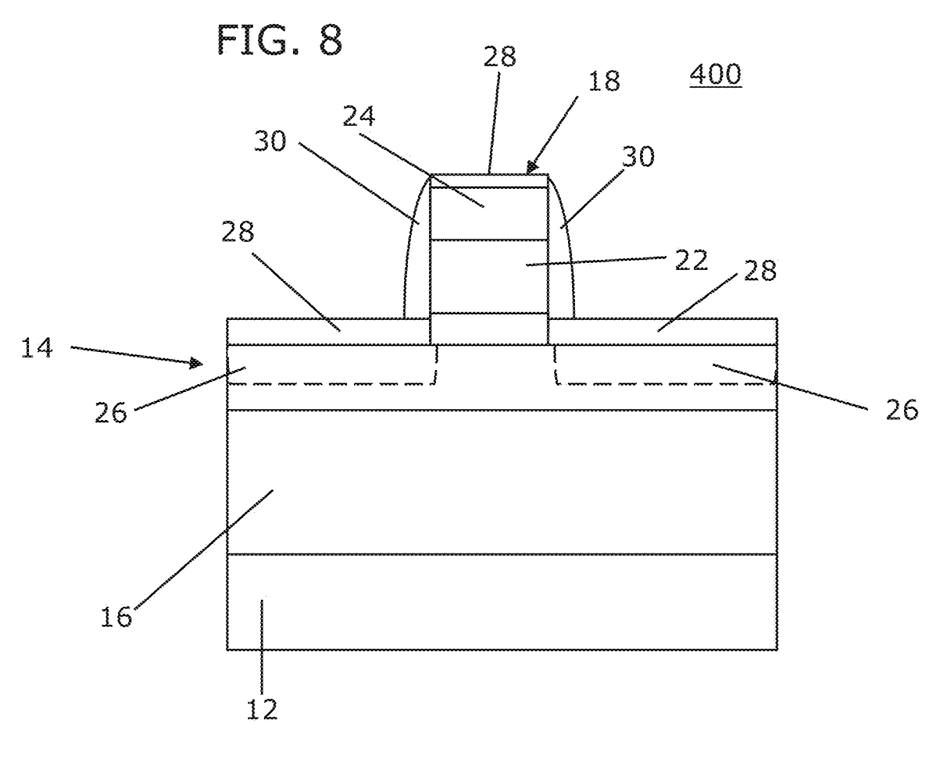
FIG. 8 is a cross-sectional view of a planar transistor device showing plasma doped extension regions with a cap layer formed on top of the fins and on top of a gate structure in accordance with another embodiment.

Referring to FIG. 8, a partially fabricated planar semiconductor device 400 is illustratively shown in accordance with the present principles. The device 400 shows an embodiment where the cap 28 is formed on top of the fins 14 and/or extensions 26 and on top of the gate structure 18. Spacers 30 are included. It should be understood that the present principles may be applied to a plurality of different device structures including vertical transistors, nanowires, planar devices, finFETs, etc. It should also be understood that the present principles are applicable to different device fabrication methods. For example, the present principles may be applied to gate first designs as well as gate last (replacement gate) designs.

Figure 9:
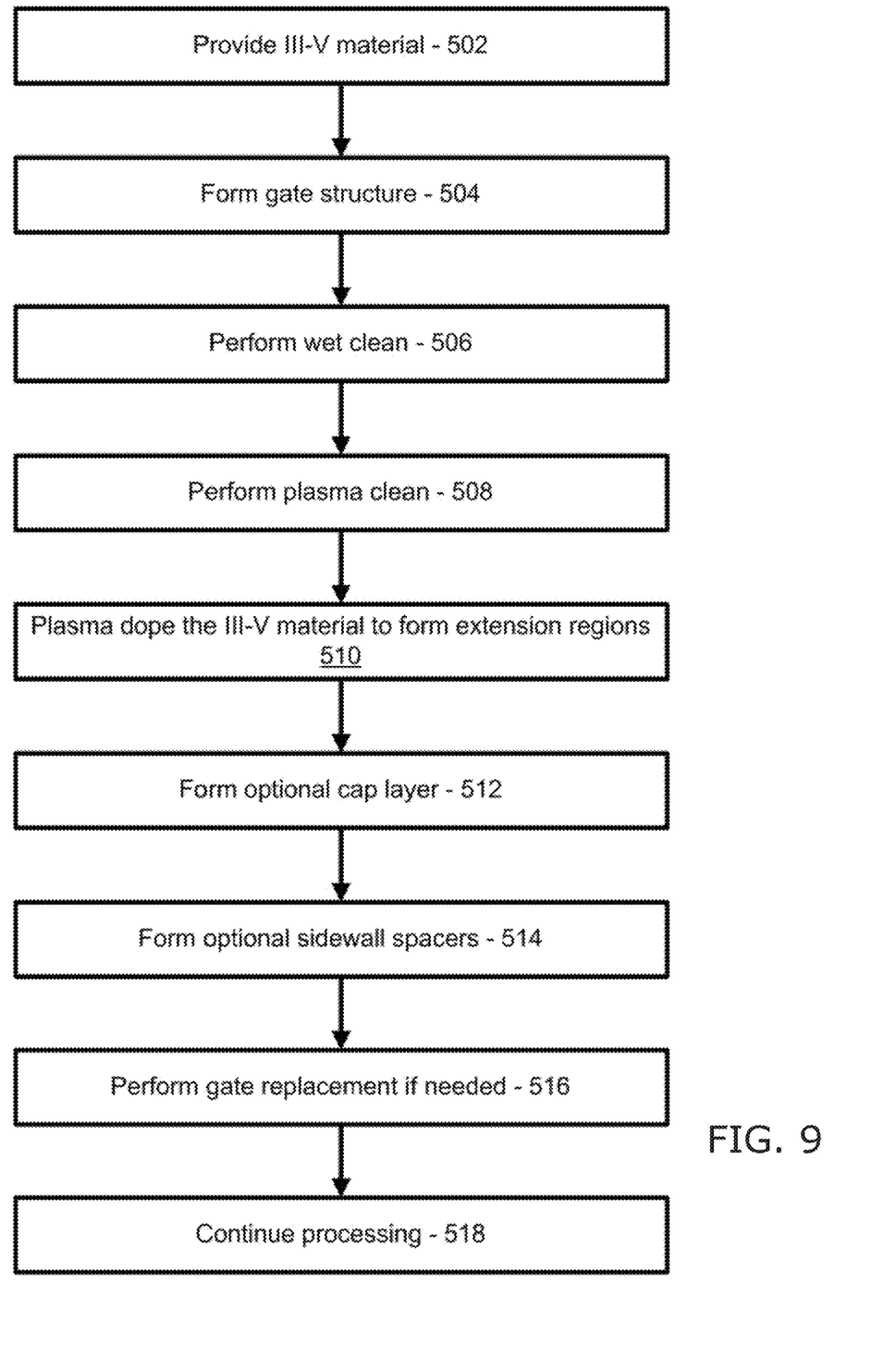
FIG. 9 is a block/flow diagram showing a method for forming an overlap transistor in accordance with the present principles.

Referring to FIG. 9, a block/flow diagram shows methods for forming an overlap transistor in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 502, a III-V material is provided. This may include a III-V substrate, a III-V layer on a Si or Ge (or other semiconductor material) substrate with one or more lattice-matching buffer layers therebetween, etc. In one embodiment, the III-V material may be formed into fins. In other embodiments, columns or nanowires may be employed. In still other embodiments, planar surfaces (for a planar device) may be employed. In block 504, a gate structure is formed over the III-V material. The gate structure includes a gate dielectric and a gate conductor (or dummy gate). The gate dielectric may include one or more layers of materials. The gate conductor may include one or more conductive layers.

In block 506, a wet cleaning of the III-V material on side regions adjacent to the gate structure is performed. The wet cleaning may include employing etchants (acids or bases) selected from the group consisting of $NH_4OH$, HCl, HF, etc. Other wet etching materials such as, e.g., $H_2S$ may also be employed. The acids or bases may be diluted. In block 508, a plasma cleaning of the III-V material on the side regions adjacent to the gate structure is performed. The plasma cleaning (ion bombardment) may include employing inert gas species selected from the group consisting of $H_2$, Ar, Xe, He and $N_2$. The plasma cleaning removes the more stable oxides to provide an oxide free III-V material. This improves doping in the next step by removing the oxide barrier.

In block 510, the III-V material is plasma doped on the side regions adjacent to the gate structure to form plasma doped extension regions that partially extend below the gate structure. The plasma doping may include doping the III-V material with a dopant selected from the group consisting of Si, Ge, Se and Te. The plasma doping may be performed in a same processing chamber as the plasma cleaning process. The plasma doping includes high temperature doping with a temperature between about 40 degrees C. and 550 degrees C. The high temperature enhances diffusion and contemporaneously activates the dopants.

In block 512, a cap layer may be formed over the III-V material by plasma deposition. The plasma deposition of the cap layer may be performed in a same processing chamber as the plasma doping process. The dopants may become deposition material or other elements may be employed. The cap layer may be selectively deposited using material selection and orientation to assist in selective deposition. In one embodiment, the cap layer is formed over the entire device. In another embodiment, the cap layer is formed over the III-V material only. In another embodiment, the cap layer is formed over horizontal surfaces. In still other embodiments, the cap layer is not formed.

In block 514, sidewall spacers are optionally formed on the gate structure. In block 516, a gate replacement may be performed in a gate last design. The dummy gate is removed and a gate dielectric and a gate conductor are deposited to replace the dummy gate (and gate dielectric in some embodiments). The gate dielectric may include one or more layers of materials. The gate conductor may include one or more conductive layers. In block 518, processing continues with the formation of metallizations (e.g., contacts, metal lines, etc.), interlevel dielectrics, etc.

Having described preferred embodiments for III-V extension by high temperature plasma doping (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming an overlap transistor, comprising:
   forming a gate structure over a III-V semiconductor material;
   wet cleaning a surface of the III-V semiconductor material on side regions adjacent to the gate structure;
   plasma cleaning the surface of the III-V semiconductor material on the side regions adjacent to the gate structure after the wet cleaning; and
   plasma doping the surface of the III-V semiconductor material on the side regions adjacent to the gate structure after the plasma cleaning to form plasma doped extension regions that partially extend below the gate structure, a portion of the III-V semiconductor material in the extension regions reacting with plasma excited radicals at a temperature that activates at least a portion of the III-V semiconductor material.

2. The method as recited in claim 1, wherein wet cleaning the III-V semiconductor material includes employing an etchant selected from the group consisting of $NH_4OH$, HCl and HF.

3. The method as recited in claim 1, wherein plasma cleaning the III-V semiconductor material includes employing inert gases selected from the group consisting of $H_2$, Ar, Xe, He and $N_2$.

4. The method as recited in claim 1, wherein plasma doping the III-V semiconductor material includes doping the III-V semiconductor material with a dopant selected from the group consisting of Si, Ge, Se and Te.

5. The method as recited in claim 1, wherein plasma doping the III-V semiconductor material includes high temperature doping with a temperature between about 40 degrees C. and about 550 degrees C.

6. The method as recited in claim 1, further comprising forming a cap layer over the III-V semiconductor material by plasma deposition.

7. The method as recited in claim 6, wherein the cap layer is formed over horizontal surfaces.

8. The method as recited in claim 1, further comprising forming sidewall spacers on the gate structure.

9. The method as recited in claim 1, wherein the plasma doped extension regions partially extend underneath a gate conductor of the gate structure.

10. The method as recited in claim 1, wherein plasma doping the surface of the III-V semiconductor material on the side regions adjacent to the gate structure comprises a perimeter region near a channel of the III-V semiconductor material receiving plasma doping.

* * * * *